United States Patent [19]
Weling et al.

[11] Patent Number: 5,378,318
[45] Date of Patent: Jan. 3, 1995

[54] PLANARIZATION

[75] Inventors: Milind Weling, San Jose; Vivek Jain, Milpitas, both of Calif.

[73] Assignee: VLSI Technology, Inc., San Jose, Calif.

[21] Appl. No.: 893,616

[22] Filed: Jun. 5, 1992

[51] Int. Cl.$^6$ ............................................. H01L 21/00
[52] U.S. Cl. .................................. 156/662; 156/643; 156/646; 156/653
[58] Field of Search ...................... 156/662, 659.1, 643, 156/646, 653

[56]  References Cited
FOREIGN PATENT DOCUMENTS

| | | |
|---|---|---|
| 0265584 | 5/1988 | European Pat. Off. . |
| 265584A2 | 5/1988 | European Pat. Off. . |
| 336461A1 | 10/1989 | European Pat. Off. . |
| 2191338A | 10/1989 | United Kingdom . |

*Primary Examiner*—R. Bruce Breneman
*Assistant Examiner*—George Goudreau
*Attorney, Agent, or Firm*—Hickman & Beyer; VLSI Technology, Inc., Legal Dept.

[57] ABSTRACT

A method for improved planarization of surface topographies encountered in semiconductor processing that involve the etch-back of exposed surfaces of an oxide of silicon and a spin-on-glass. The oxide of silicon is chosen to be oxygen-deficient and thus silicon-rich, with a spectroscopically-defined silicon richness coefficient CSR that is greater than 0, and preferably greater than 0.005. A fluorine-containing process gas such as $CHF_3$ combined with one or more of $CF_4$, $C_2F_6$ and $SF_6$ can be used in the etch chemistry. Sensitivity of the etch rate to certain parameters, such as the relative surface area of the exposed oxide of silicon and the fraction of fluorine present, is either reduced or eliminated. Improvement and better control of planarization is achieved by the process, resulting in a widening of the etch-back process window.

50 Claims, 3 Drawing Sheets

PLANARIZATION

BACKGROUND OF THE INVENTION

This invention relates to etching of thin films used for semiconductor manufacturing and to improvements in planarization obtained with such films.

Planarization in semiconductor processing involves deposition of a sacrificial layer of material that is then etched back to provide a surface that is smoother than the surface on which the sacrificial layer is deposited. This is illustrated in FIG. 1, in which a substrate 13 has a plurality of metal or other electrical conducting lines 15, 17 and 19 at spaced apart positions. Another layer of metal lines (not shown) is to be deposited above this structure in fabrication of an integrated circuit, and the two sets of lines must be electrically insulated from each other. A layer of an oxide of silicon 21, which will serve as an electrical insulator, is then deposited conformally on the substrate 13 and on the metal lines 15, 17 and 19 so that the metal lines are fully covered with insulating material. Ideally, the oxide of silicon layer 21 would also provide a smooth, planar exposed surface at the top of this structure so that planarization would not be necessary. In practice, the exposed surface of the oxide of silicon layer 21 is "bumpy" wherever a metal line, such as 15, 17 or 19, lies directly underneath. To remedy this and to provide a smoother surface, a sacrificial layer 23 of another insulating material. such as spin-on-glass (SOG), is deposited over the oxide of silicon to provide a smoother exposed surface, and the exposed surface is etched back to a position such as a plane LL indicated in FIG. 1.

Where only the SOG material 23 is exposed, the etch rate can be well controlled because the surface is homogeneous. However, as soon as portions of the underlying oxide of silicon layer 21 are exposed, the homogeneous layer becomes instead a patterned structure with two (or more) distinct materials being etched back. The etch rates of the SOG may be considerably influenced by the amount of the exposed underlying oxide.

Planarization of a patterned structure containing disparate materials, such as the oxide of silicon and SOG layer exposed at the plane in FIG. 1, has been studied by many workers. One goal is improving the quality of such planarized surfaces. Problems arise because of the strong dependence of etch rate of spin-on-glass on certain parameters such as (1) the relative surface area of the oxide of silicon being exposed and etched and (2) the relative percentage the etchant gases such as $CHF_3$ and $C_2F_6$.

Where a patterned structure such as 11 shown in FIG. 1 is developed, containing exposed surfaces of two or more semiconductor processing materials, maintenance of acceptable planarization is difficult at best. The two materials may have very different etch rates for the type of etch chemistry used. During etchback of patterned structures exposed surfaces, such as (1) a stoichiometric silicon dioxide (SD) material and (2) an SOG material, may be plasma etched simultaneously. The spin-on glass may be either a siloxane or a silicate based glass. As seen from FIG. 1, a patterned wafer has SOG covering its surface prior to etchback. In the initial stages of the etch process, the SOG etch rate is fairly constant. However, as the etch proceeds, the underlying oxide is exposed. This exposed oxide tends to increases the etch rate of the SOG adjacent to the exposed oxide. The oxide etch rate remains unchanged during the entire etch process. This concept could be understood by defining a parameter called selectivity given by $$S(SOG;SD) = r(SOG)/r(SD). \quad (1)$$

As can be seen from the above discussion, the etch selectivity varies as the SOG etch rate depending on the amount of oxide exposed. In order to maintain good planarization, it is very important to etch the SOG and the oxide at the same rate. In other words, the selectivity during the entire etch process should remain constant and close to unity.

Planarization can be significantly degraded if the SOG etch rate is higher than the etch rate of the oxide (S for a patterned wafer $>1$). The quality of planarization of a surface developed in a semiconductor processing material is often measured by analyzing the dimensions of a gap in an otherwise-planar surface, as illustrated schematically in FIG. 2. The ratio R of the horizontal width A of the gap to the vertical depth B is a quantitative measure of quality of planarization. The higher the ratio R the better the planarization. For good planarization, the width of a gap relative to its depth should be very large and $R \gg 1$. As the value of R decreases, subsequently formed layers may have poor step coverage and may thereby leave behind undesirable stringers after the etch process is terminated.

Many workers in semiconductor processing have sought solutions for this selectivity problem. Vines and Gupta, in "Interlevel Dielectric Planarization With Spin-on Glass Films", VMIC Conf. Proc., 1986, pp. 506-515, discuss the state of the art of interlevel planarization in 1986, noting that a spin-on glass etch rate which is independent of the amount of etchback is desirable for accurate transfer of the smooth topography of a sacrificial layer to an underlying oxide layer.

Hausamann and Mokrisch, in "The Dependence Of Oxide And Spin-on Glass Etchrates On Their Area Ratio", VMIC Confer. Proc., 1988, pp. 293-298, noted the appearance of an unexpected dependence of SOG etch rate on oxide exposure from a plasma enhanced chemical vapor deposition (PECVD) film during etchback for planarization. This observed effect was probably due to oxygen loading. The simultaneous presence of oxide of silicon and SOG on patterned wafers was simulated with unpatterned oxide and SOG wafers and the addition of oxygen as a process gas to the etch chemistry. As can be seen from their results shown in FIG. 3, increasing the amount of oxygen increases the SOG etch rate, whereas the oxide etch rate remains almost unchanged. The authors suggest use of a two-step process. In the first step, approximately 60 percent of the SOG thickness would be removed. In the second step, the oxide and the remaining SOG would be etched with a lower selectivity etchant.

Bogle-Rohwer and Nulty, in "SOG/PSG Etchback Planarization Process", Proc. S.P.I.E., vol. 1392, 1991, pp. 280-290, describe the effect of use of $CHF_3$, $CF_4$, $C_2F_6$, $SF_6$ and Ar gases as etchant components for simultaneous etchback of SOG and SD material. Processes having initial selectivity $S(SOG;SD)=1.0$ were not successful in planarizing structures over patterned wafers. Use of pure $CHF_3$ or pure Ar as the etchant process gas produced no significant etching of the SOG. Use of fluorine-rich gases, such as $CF_4$, $C_2F_6$ and $SF_6$, in various mixtures produced adequate etching, although planarization was still a problem.

One persistent problem here is that the SOG etch rate r(SOG) increases with increased exposure of the oxide adjacent to the etch site. Therefore, the SOG etch rate r(SOG) and the selectivity S for any localized region on a wafer may not be constant throughout an etch process. This phenomenon is often referred to as micro-loading. Conventionally, micro-loading has been compensated for by using an SOG material and an etchant that provide a selectivity S(SOG;SD) as low as 0.5 for unpatterned wafers. With a selectivity less than unity on these unpatterned wafers, the SOG etch rate is made deliberately less then the oxide etch rate. This compensates for the increase in SOG etch rate seen on patterned wafers with exposure of the underlying oxide. Thus, a selectivity less than 1 on unpatterned wafers translates to a selectivity close to 1 on patterned wafers. These selectivities are attained by using a fluorine-containing etchant gas, such as $CHF_3$ combined with a small fraction of $CF_4$, $C_2F_6$ or $SF_6$, as the process gas. Improvements in control, using this approach, were demonstrated by Bogle-Rohwer and Nulty, op. cit. The effect of the micro-loading problem is reduced somewhat.

Another problem occurs with this approach. Polymer formation within the process gas is enhanced in a fluorine-deficient environment, such as use of a pure $CHF_3$ etchant, and polymer formation degrades the etch chamber cleanliness and degrades the uniformity of the etch process.

Another persistent problem is that the selectivity S(SOG;SD) for these two materials varies with the fraction $f(CHF_3)$ of $CHF_3$ present in the etchant gas. This etchant component is a preferred etchant. However, the selectivity S for stoichiometric silicon dioxide SD decreases dramatically with increasing fraction of $CHF_3$ present.

These problems have prevented achievement of acceptable planarization for a patterned semiconductor structure. What is needed is an approach to planarization of topographies encountered in semiconductor processing that: (1) provides relative insensitivity of SOG etch rates to modest percentage changes in the amount of exposed oxide area and (2) improves planarization and the controllability and reproducibility of the planarization process.

SUMMARY OF THE INVENTION

These needs are met by the invention, which provides a method for improvement of planarization of patterned structures having exposed surfaces of two or more materials using an etchback process. This has been achieved in the case where the two exposed materials are an oxide of silicon and SOG by modifying the composition of the oxide film. The oxide film is enriched with silicon with an average composition represented by $SiO_x$ with $x<2$. A stoichiometric oxide would correspond to $x=2$. The etchant process gas preferably includes $CHF_3$ and $C_2F_6$.

By providing an oxygen-deficient, silicon-rich oxide (SRO), the sensitivity of etch rate of spin-on-glass to the exposed amount of the oxide is reduced and the quality and smoothness of a planarized layer are improved. Using a silicon-rich oxide also makes the selectivity less dependent on the relative percentage of the fluorine-richness of the etch chemistry.

Another benefit of the invention is that the silicon-richness of the oxide of silicon and the fluorine content of the etchant gases can be independently varied to achieve a wide range of selectivities. This technique extends to use of other spin-on-materials (SOM), such as polyimide or photoresist material, in place of the SOG. These features significantly widen the process window for the etchback process.

These and other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
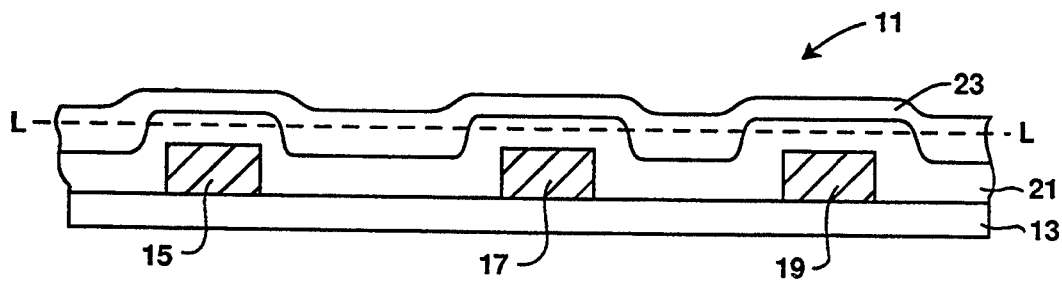
FIG. 1 is a schematic sectional view of a portion of a multi-layer integrated circuit to which planarization is applied.

We have discovered that use of a silicon-rich, hence oxygen-deficient, oxide (SRO) and SOG in a patterned surface will (1) compensate for the micro-loading effects, (2) decrease the strong dependence of selectivity S on the fraction of $CHF_3$ present in the etchant gas and (3) widen the process window for the etchback process. We have experimentally determined the selectivity, as a function of $f(CHF_3)$ for four oxides of silicon, including SD, and have plotted these results in FIG. 4. These results were obtained using unpatterned wafers of stoichiometric oxide ($SiO_x$ with $x=2$) and unpatterned wafers of SRO ($x<2$), of thickness 5,000 Å, both formed as PECVD films, with a film of SOG of thickness 4,500 Å adjacent to each such wafer, using a GCA 650 Triode Etcher. The process gas or etchant was a mixture of $CHF_3$ and $C_2F_6$, total pressure was 225 millitorr, applied power was 300 Watts RIE, and the process gas component flow rates (measured in sccm) for the two components were $CHF_3:C_2F_6=150:30$, 155:25, 160:20, 165:15, 170:10 and 175:5. As the $CHF_3:C_2F_6$ ratio increases, the relative amount of fluorine for this combination decreases.

Figure 4:
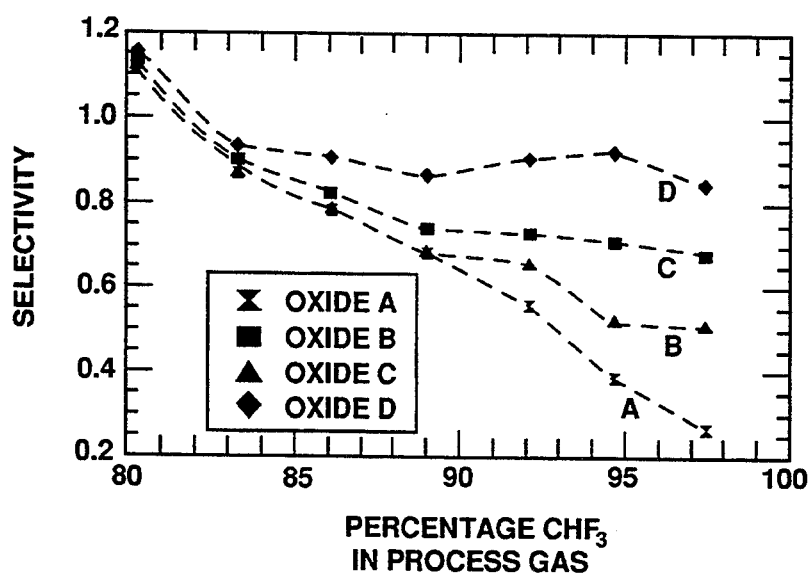
FIG. 4 is a graphical view of SOG: oxide selectivity ratios versus fraction of $CHF_3$ present in the etchant process gas, for varying relative amounts of silicon in a silicon-rich oxide, used according to the invention, and in conventional silicon dioxide.

Curve A of FIG. 4 corresponds to (stoichiometric) silicon dioxide $SiO_x$ with $x=2$. Curves B, C and D in FIG. 4 correspond to oxides of silicon with increasing silicon richness in going from curve B to curve C to curve D. Note that the selectivity S(SOG;SRO) is much less sensitive to changes in the fraction $f(CHF_3)$ than is S(SOG;SD), where the oxygen fraction of the oxide of silicon is reduced. Also note that, for $f(CHF_3) \leq 0.85$, selectivity S(SOG;SRO) is approximately independent of the relative amounts of Si and O present in the oxide of silicon material. Different values of selectivity S(SOG;SRO) can be obtained: (1) by changing The relative amount of oxygen present in the SRO material while keeping the fraction f(CHF$_3$) constant; (2) by changing the fraction f(CHF$_3$) present in the etchant or process gas while keeping the relative amount of oxygen present in the SRO material constant. A fraction f(CHF$_3$) less than 1.0 is preferred. The results shown in FIG. 4 are qualitatively similar where the spin-on-glass (SOG) is replaced by a spin-on-material (SOM), such as polyimide or photoresist material.

Figure 5A:
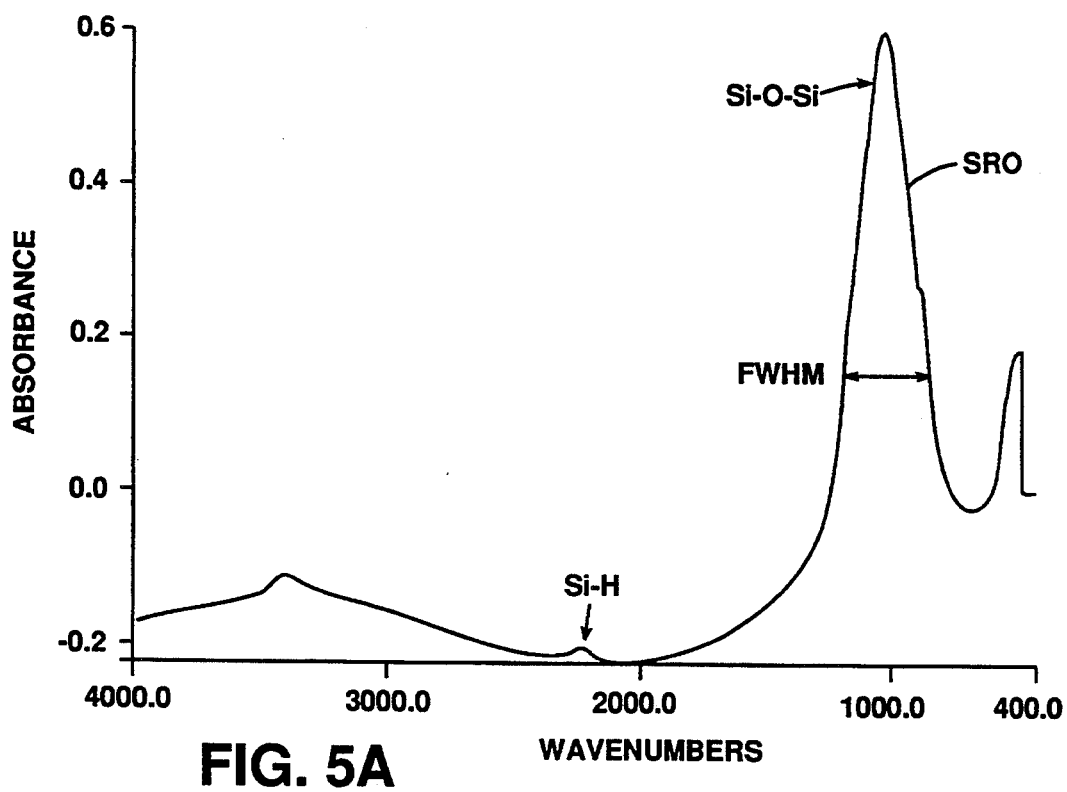
FIGS. 5A and 5B are graphical views of measured spectroscopic peak intensity of Si—H and Si—O stretching vibrations for a silicon-rich oxide and a stoichiometric oxide, respectively.
Figure 5B:
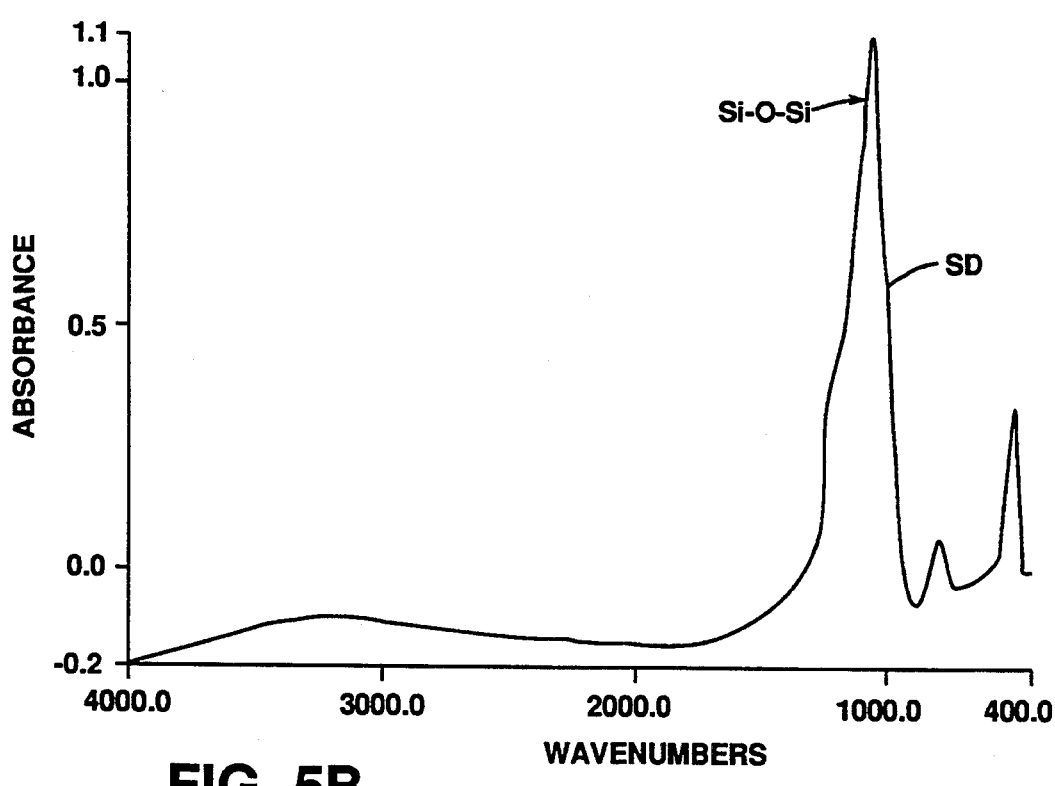

The relative amounts of Si and O present in the three non-stoichiometric SRO materials used for FIG. 4 are most easily characterized by measurement of the refractive index RI of the OS material for a selected wavelength of light, such as $\lambda = 0.633$ $\mu$m. We have also characterized the relative silicon content in an oxide of silicon by spectroscopic techniques, using the relative spectroscopic absorption peak intensities for an Si—O—Si stretching vibration and an Si—H stretching vibration shown in FIGS. 5A and 5B, respectively, to determine the relative amounts of Si and O present. In silicon dioxide, the Si—H absorption peak is zero, relative to a background absorption line BL that is subtracted out. In a non-stoichiometric oxide of silicon such as SRO, unsaturated Si bonds are present that can accept H atoms and thus produce characteristic Si—H absorption. The silicon richness coefficient CSR is defined as:

$$CSR = I(Si-H)/I(Si-O-Si), \quad (2)$$

where I is the measured absorption peak of the indicated stretching vibration. Table 1 exhibits the selectivity S, the refractive index RI and the silicon richness coefficient CSR for f(CHF$_3$) = 0.9 for the results of FIG. 4.

TABLE 1

Selectivity Versus Oxygen Content of Oxide

| Silicon richness coefficient | Refractive index | Selectivity S(OS; SOG) |
| --- | --- | --- |
| CSR = 0 | n = 1.46 | S = 0.64 |
| CSR = 0.005 | n = 1.52 | S = 0.68 |
| CSR = 0.01 | n = 1.54 | S = 0.76 |
| CSR = 0.02 | n = 1.57 | S = 0.88 |

Figure 3:
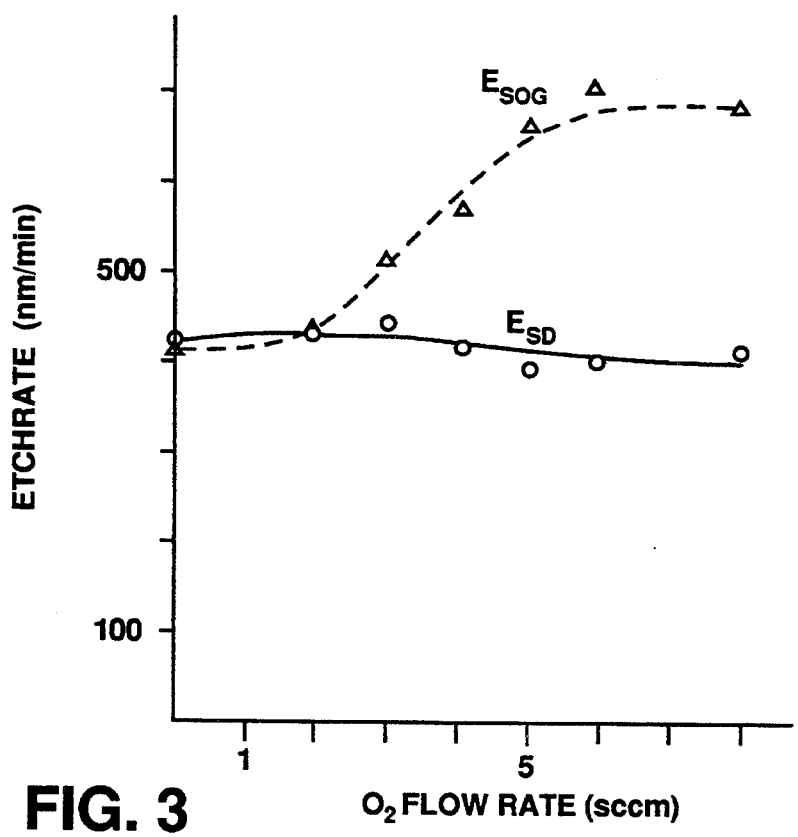
FIG. 3 is a graphical view of etch rates of SOG and oxide of silicon versus flow rate of oxygen supplementing the etchant process gas.

The results of FIG. 3 provide confirmation that control of the amount of local free oxygen adjacent to the etch site is a key to control of selectivity and of the quality of planarization for a patterned structure containing SOG and an oxide of silicon. Where silicon-rich oxide is used according to the invention, the etch rate r(SOG) does not vary so dramatically with oxygen released from etching (FIG. 3) or with the percentage of CHF$_3$ present in the etchant (FIG. 4).

Figure 2:
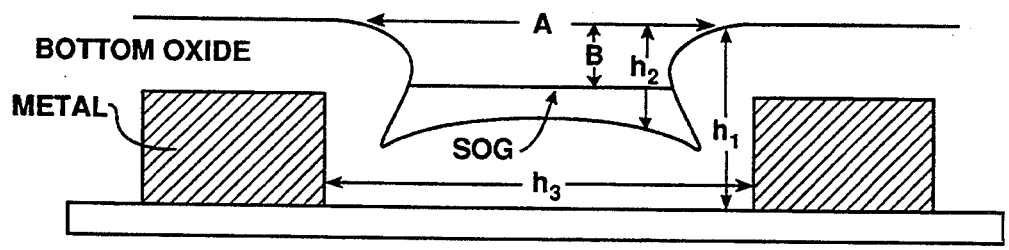
FIG. 2 is a schematic sectional view of typical multi-layer semiconductor processing materials to which the invention is applicable.

Improvements in planarization using the invention have been quantified by performing etchback experiments on the configuration shown in FIG. 2, where the relevant layer dimensions are initial oxide thickness $h_1 = 5000$ Å, initial SOG thickness $h_2 = 2800$ Å, and inter-metal (IM) spacing $h_3 = 1.1$ $\mu$m, 1.2 $\mu$m and 1.7 $\mu$m. The ratio R = A/B was measured for oxide of silicon material with CSR = 0 and with CSR = 0.02 after etchback of 4,500 Å of SOG, and the results are illustrated in Table 2. The figure of merit $$\eta = R(CSR)/R(CSR=0) \quad (3)$$

is a measure of improvement of planarization, using the invention. The planarization improvement is greater for relatively narrow spaces with small inter-metal spacings (for example, $h_3 = 1.1$ or 1.2 $\mu$m) than for larger inter-metal spacings, and the dimensionless figure of merit $\eta$ appears to increase monotonically with decreasing spacing $h_3$.

TABLE 2

| | Relative Planarization Improvements | | |
| --- | --- | --- | --- |
| IM spacing $h_3$ | Planariz. R(CSR = 0) | Planariz. R(CSR = 0.02) | $\eta$ |
| 1.1 $\mu$m | 3.42 | 4.60 | 1.350 |
| 1.2 $\mu$m | 2.29 | 2.64 | 1.150 |
| 1.7 $\mu$m | 4.12 | 4.14 | 1.003 |

Figure 6A:
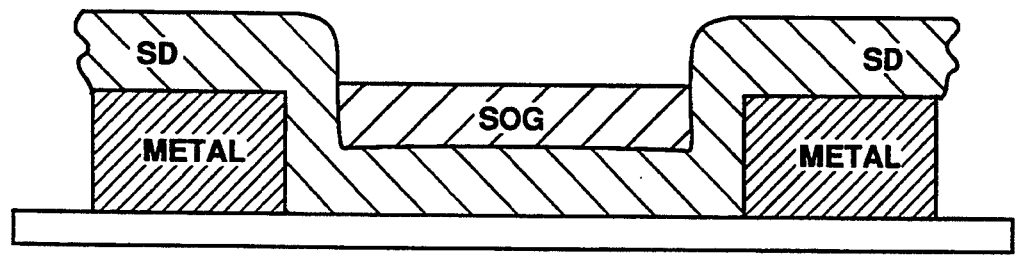
FIGS. 6A and 6B are schematic views of etchback of patterned, multi-layer semiconductor processing materials with the invention applied.
Figure 6B:
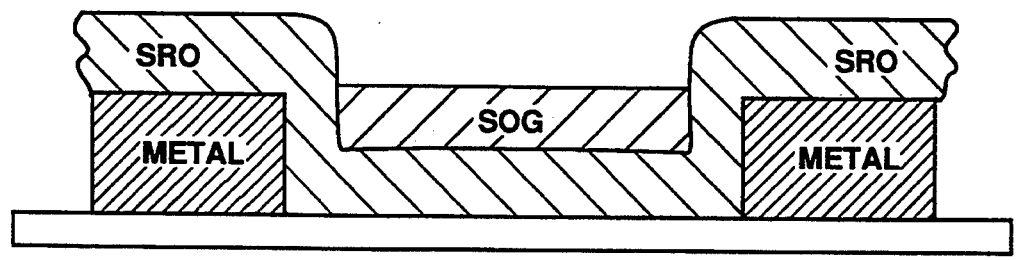

FIGS. 6A and 6B, which are analogous to FIG. 2, schematically compare planarization of a patterned structure containing exposed surfaces of SOG and an oxide of silicon that is either stoichiometric (FIG. 6A) or silicon-rich (FIG. 6B). The improvement in planarization is substantial.

The temperature at which plasma etching is performed may vary from 50° C. to as high as 250° C., and the silicon richness coefficient CSR may be as high as desired. For example, the silicon-rich oxide 21 shown in FIG. 1 may be replaced by amorphous silicon, with no oxygen present in the insulator material. This invention is also applicable to other SOM, such as polyimide or photoresist materials, used instead of SOG for the sacrificial layer.

While this invention has been described in terms of several preferred embodiments, it is contemplated that alterations, modifications and permutations thereof will become apparent to those skilled in the art upon a reading of the specification and study of the drawings. It is intended that the appended claims include all such alterations, modifications and permutations as fall within the spirit and scope of the present invention.

What is claimed is:

1. A method for improved planarization comprising the steps of:
   providing a patterned structure of material containing at least one exposed surface of non-stoichiometric, silicon-rich-oxide (SRO) and at least one exposed surface of a spin-on-material; and
   etching said patterned structure with a fluorine-containing process gas;
   whereby the etch rates of the exposed surfaces of said silicon-rich-oxide and said spin-on-material are about the same.

2. The method of claim 1, further comprising the step of choosing said silicon-rich-oxide with a silicon richness coefficient CSR greater than zero.

3. The method of claim 1, further comprising the step of choosing as said process gas a gas that contains essentially no oxygen.

4. The method of claim 1, further comprising the step of including CHF$_3$ in said process gas.

5. The method of claim 4, further comprising the step of including another fluorine-containing gas in addition to said CHF$_3$ in said process gas.

6. The method of claim 5, further comprising the step of choosing as said process gas a mixture of a gas containing CHF₃ and a gas selected from the group consisting of CF₄, C₂F₆ and SF₆.

7. The method of claim 1, further comprising the step of selecting said silicon-rich oxide so that its refractive index is greater than 1.46.

8. The method of claim 1, further comprising the step of selecting said process gas so that the selectivity of said spin-on-material relative to said silicon-rich-oxide, defined as the ratio of etch rate of the spin-on-material divided by the etch rate of the silicon-rich-oxide in a patterned structure, is approximately 1.

9. The method of claim 1, further comprising the step of forming said silicon-rich oxide by a PECVD process.

10. The method of claim 1, wherein said spin-on-material is drawn from a class of semiconductor processing materials consisting of spin-on-glass, polyimide and photoresist material.

11. The method of claim 10, further comprising the steps of selecting spin-on-glass as said spin-on-material and selecting said spin-on-glass from the group consisting of siloxane and silicate-based glass.

12. The method of claim 1, further comprising the step of performing said etching step at a temperature $T_p$ of between 50° C. and 250° C.

13. A method for improved planarization of a patterned structure of material containing exposed surfaces of an oxide of silicon (OS) and a spin-on-material (SOM) by choice of a desired selectivity S(SOM;OS), defined as the ratio of the etch rate of the SOM divided by the etch rate of the OS, the method comprising the steps of:
providing a patterned structure of material containing at least one exposed surface of a OS and at least one exposed surface of SOM, wherein the OS has a silicon richness coefficient CSR greater than zero;
providing a process gas containing fluorine for etching the patterned layer;
selecting a desired selectivity S(SOM;OS) for the SOM and OS materials contained in the patterned structure;
etching the patterned layer with the process gas; and
adjusting the silicon richness coefficient and the fraction of fluorine contained in the process gas to obtain the desired selectivity when the patterned structure is etched.

14. The method of claim 13, further comprising the step of choosing said silicon-rich-oxide with a silicon richness coefficient CSR greater than zero.

15. The method of claim 13, further comprising the step of choosing as said process gas a gas that contains essentially no oxygen.

16. The method of claim 13, further comprising the step of including CHF₃ in said process gas.

17. The method of claim 16, further comprising the step of including another fluorine-containing gas in addition to said CHF₃ in said process gas.

18. The method of claim 17, further comprising the step of choosing as said process gas a mixture of a gas containing CHF₃ and a gas selected from the group consisting of CF₄, C₂F₆ and SF₆.

19. The method of claim 13, further comprising the step of selecting said silicon-rich oxide so that its refractive index is greater than 1.46.

20. The method of claim 13, further comprising the step of selecting said process gas so that the selectivity of said spin-on-material relative to said silicon-rich-oxide, defined as the ratio of etch rate of the spin-on-material divided by the etch rate of the silicon-rich-oxide in a patterned structure, is about 1.

21. The method of claim 13, further comprising the step of forming said silicon-rich oxide by a PECVD process.

22. The method of claim 13, wherein said spin-on-material is drawn from a class of semiconductor processing materials consisting of spin-on-glass, polyimide and photoresist material.

23. The method of claim 22, further comprising the steps of selecting spin-on-glass as said spin-on-material and selecting said spin-on-glass from the group consisting of siloxane and silicate-based glass.

24. The method of claim 13, further comprising the step of performing said etching step at a temperature $T_p$ of between 50° C. and 250° C.

25. A method for control of the micro-loading effect in a patterned structure of material containing exposed surfaces of an oxide of silicon and a spin-on-material, the method comprising the steps of:
providing a patterned structure of material containing at least one exposed surface of silicon-rich-oxide (SRO) with a silicon richness coefficient CSR greater than zero and at least one exposed surface of spin-on-material; and
etching the patterned structure with a fluorine-containing process gas;
whereby the etch rates of the exposed surfaces of the silicon-rich-oxide and the spin-on-material are about equal during the time etching occurs.

26. The method of claim 25, further comprising the step of choosing as said process gas a gas that contains essentially no oxygen.

27. The method of claim 25, further comprising the step of including CHF₃ in said process gas.

28. The method of claim 25, further comprising the step of including another fluorine-containing gas in addition to said CHF₃ in said process gas.

29. The method of claim 27, further comprising the step of choosing as said process gas a mixture of a gas containing CHF₃ and a gas selected from the group consisting of CF₄, C₂F₆ and SF₆.

30. The method of claim 25, further comprising the step of selecting said silicon-rich oxide so that its refractive index is greater than 1.46.

31. The method of claim 25, further comprising the step of selecting said process gas so that the selectivity of said spin-on-material relative to said silicon-rich-oxide, defined as the ratio of etch rate of the spin-on-material divided by the etch rate of the silicon-rich-oxide in a patterned structure, is about 1.

32. The method of claim 25, further comprising the step of forming said silicon-rich oxide by a PECVD process.

33. The method of claim 25, wherein said spin-on-material is drawn from a class of semiconductor processing materials consisting of spin-on-glass, polyimide and photoresist material.

34. The method of claim 33, further comprising the steps of selecting spin-on-glass as said spin-on-material and selecting said spin-on-glass from the group consisting of siloxane and silicate-based glass.

35. The method of claim 25, further comprising the step of performing said etching step at a temperature $T_p$ of between 50° C. and 250° C.

36. A method for reduction of the effect on selectivity of fluorine content in an etchant gas containing fluorine that is used to etch a patterned structure of material containing exposed surfaces of an oxide of silicon and a spin-on-material, the method comprising the steps of:

provviding a patterned structure of material containing at least one exposed surface of silicon-rich-oxide (SRO) with a silicon richness coefficient CSR greater than zero and at least one exposed surface of spin-on-material; and etching the patterned structure with a fluorine-containing process gas;

whereby the etch rates of the exposed surfaces of the silicon-rich-oxide and the spin-on-material are about equal during the time etching occurs.

37. The method of claim 36, further comprising the step of choosing as said process gas a gas that contains essentially no oxygen.

38. The method of claim 36, further comprising the step of including $CHF_3$ in said process gas.

39. The method of claim 38, further comprising the step of including another fluorine-containing gas in addition to said $CHF_3$ in said process gas.

40. The method of claim 38, further comprising the step of choosing as said process gas a mixture of a gas containing $CHF_3$ and a gas selected from the group consisting of $CF_4$, $C_2F_6$ and $SF_6$.

41. The method of claim 36, further comprising the step of selecting said silicon-rich oxide so that its refractive index is greater than 1.46.

42. The method of claim 36, further comprising the step of selecting said process gas so that the selectivity of said spin-on-material relative to said silicon-rich-oxide, defined as the ratio of etch rate of the spin-on-material divided by the etch rate of the silicon-rich-oxide in a patterned structure, is about 1.

43. The method of claim 36, further comprising the step of forming said silicon-rich oxide by a PECVD process.

44. The method of claim 36, wherein said spin-on-material is drawn from a class of semiconductor processing materials consisting of spin-on-glass, polyimide and photoresist material.

45. The method of claim 44, further comprising the steps of selecting spin-on-glass as said spin-on-material and selecting said spin-on-glass from the group consisting of siloxane and silicate-based glass.

46. The method of claim 36, further comprising the step of performing said etching step at a temperature $T_p$ of between 50° C. and 250° C.

47. The method of claim 1 wherein the composition of said SRO is selected to produce an etch rate of said SRO which is about the same as the etch rate of said spin-on-material.

48. The method of claim 1 wherein the composition of said process gas is selected to produce an etch rate of said SRO which is about the same as the etch rate of said spin-on-material.

49. The method of claim 1 wherein the selectivity of said patterned structure is about the same as the selectivity of an unpatterned structure of material containing at least one exposed surface of an exposed surface of non-stoichiometric, silicon-rich-oxide (SRO) and at least one exposed surface of a spin-on-material due to the composition of said SRO.

50. The method of claim 2 wherein said CSR is greater than or equal to 0.005.

* * * * *